United States Patent
Takata

(10) Patent No.: US 9,614,278 B2
(45) Date of Patent: Apr. 4, 2017

(54) LADDER FILTER AND DUPLEXER

(71) Applicant: Murata Manufacturing Co., Ltd., Nagaokakyo-shi, Kyoto-fu (JP)

(72) Inventor: Toshiaki Takata, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 80 days.

(21) Appl. No.: 14/840,108

(22) Filed: Aug. 31, 2015

(65) Prior Publication Data

US 2016/0065174 A1    Mar. 3, 2016

(30) Foreign Application Priority Data

Sep. 3, 2014   (JP) ................................. 2014-179347

(51) Int. Cl.
| | | |
|---|---|---|
| *H01Q 1/50* | (2006.01) | |
| *H03H 9/72* | (2006.01) | |
| *H01Q 5/50* | (2015.01) | |
| *H03H 9/00* | (2006.01) | |
| *H03H 9/64* | (2006.01) | |

(52) U.S. Cl.
CPC ................. *H01Q 1/50* (2013.01); *H01Q 5/50* (2015.01); *H03H 9/725* (2013.01); *H03H 9/0009* (2013.01); *H03H 9/6469* (2013.01)

(58) Field of Classification Search
None
See application file for complete search history.

(56) References Cited

U.S. PATENT DOCUMENTS

| | | | | |
|---|---|---|---|---|
| 8,222,973 B2* | 7/2012 | Takata | ................. | H03H 9/0222 310/313 C |
| 8,552,618 B2* | 10/2013 | Okumichi | .......... | H03H 9/02763 310/313 B |
| 8,723,620 B2* | 5/2014 | Nishimura | ............. | H03H 9/008 333/126 |
| 2001/0013739 A1 | 8/2001 | Yoshida et al. | | |
| 2004/0095206 A1 | 5/2004 | Tsutsumi et al. | | |
| 2004/0174233 A1* | 9/2004 | Takayama | .......... | H03H 9/02661 333/193 |
| 2004/0227587 A1 | 11/2004 | Inoue et al. | | |
| 2005/0046520 A1 | 3/2005 | Nishizawa et al. | | |
| 2007/0109073 A1* | 5/2007 | Yamakawa | .............. | H03H 9/25 333/133 |
| 2012/0032753 A1 | 2/2012 | Nishimura et al. | | |

(Continued)

FOREIGN PATENT DOCUMENTS

| | | |
|---|---|---|
| JP | 2001-036378 A | 2/2001 |
| JP | 2004-343168 A | 12/2004 |

(Continued)

*Primary Examiner* — Trinh Dinh
(74) *Attorney, Agent, or Firm* — Keating & Bennett, LLP

(57) ABSTRACT

A ladder filter includes a plurality of series-arm resonators and parallel-arm resonators including surface acoustic wave resonators. A metallization ratio of the series-arm resonator having the smallest electrostatic capacity among the plurality of series-arm resonators is the smallest among the plurality of series-arm resonators and an electrode finger pitch of the series-arm resonator having the smallest electrostatic capacity is the largest among electrode finger pitches of the plurality of series-arm resonators.

20 Claims, 16 Drawing Sheets

(56) References Cited

U.S. PATENT DOCUMENTS

2012/0188026 A1* 7/2012 Yamaji ............... H03H 9/14535
                                                                          333/133
2013/0257562 A1   10/2013  Schmidhammer

FOREIGN PATENT DOCUMENTS

| JP | 2013-168996 A | 8/2013 |
|----|---------------|--------|
| JP | 2013-539308 A | 10/2013 |
| KR | 10-2004-0028583 A | 4/2004 |
| KR | 10-2004-0088522 A | 10/2004 |

\* cited by examiner

LADDER FILTER AND DUPLEXER

BACKGROUND OF THE INVENTION

1. Field of the Invention

The present invention relates to a ladder filter including a plurality of elastic wave resonators and to a duplexer including the ladder filter as a transmission filter.

2. Description of the Related Art

In the related art, ladder surface acoustic wave filters are widely used in transmission filters of duplexers of cellular phone devices and so forth. An example of such a duplexer is disclosed in Japanese Unexamined Patent Application Publication No. 2013-168996. In Japanese Unexamined Patent Application Publication No. 2013-168996, a series-arm resonator having the largest electrostatic capacity among a plurality of series-arm resonators of a ladder surface acoustic wave filter is arranged at the side of a transmission terminal.

As described in Japanese Unexamined Patent Application Publication No. 2013-168996, the power durability can be made high by making the electrostatic capacity of the series-arm resonator closest to the transmission terminal, that is, the input terminal, the highest. However, there is a problem in that when the electrostatic capacity becomes large, electrical characteristics are degraded.

SUMMARY OF THE INVENTION

Accordingly, preferred embodiments of the present invention provide a ladder filter capable of having a high electric power handling capability without the electrical characteristics being degraded.

A ladder filter according to a preferred embodiment of the present invention includes a plurality of series-arm resonators including a surface acoustic wave resonator, and a parallel-arm resonator including a surface acoustic wave resonator. A metallization ratio of a series-arm resonator having a smallest electrostatic capacity among the plurality of series-arm resonators is smallest among the plurality of series-arm resonators and an electrode finger pitch of the series-arm resonator having the smallest electrostatic capacity is largest among electrode finger pitches of the plurality of series-arm resonators.

In a certain specific aspect of a ladder filter according to a preferred embodiment of the present invention, at least three series-arm resonators are provided. In this case, since at least three series-arm resonators are provided, an electric power handling capability is even higher and degradation of electrical characteristics, in particular, a VSWR characteristic is significantly reduced or prevented.

In another specific aspect of a ladder filter according to a preferred embodiment of the present invention, the series-arm resonator having the smallest electrostatic capacity is serially divided so as to include a first division resonator and a second division resonator connected in series with the first division resonator. In this case, the power durability is increased even higher.

In yet another specific aspect of a ladder filter according to a preferred embodiment of the present invention, the ladder filter further includes an input terminal and an output terminal, the plurality of series-arm resonators are provided in a series arm that links the input terminal and the output terminal to each other, and the series-arm resonator having the smallest electrostatic capacity is closest to the input terminal among the plurality of series-arm resonators. The largest power is applied to the series-arm resonator closest to the input terminal. Therefore, the power durability is even higher and degradation of electrical characteristics such as a VSWR characteristic is not likely to occur.

Ladder filters according to various preferred embodiments of the present invention are preferably used as a transmission filter, for example. Since an electric power handling capability is more strongly demanded in a transmission filter, various preferred embodiments of the present invention are more effective.

A duplexer according to another preferred embodiment of the present invention includes a transmission filter including the ladder filter according to one of the various preferred embodiments of the present invention and a reception filter, one end of which defines a common connection with one end of the transmission filter. In a duplexer according to a preferred embodiment of the present invention, the power durability is improved and degradation of a VSWR characteristic is suppressed in the transmission filter and therefore electrical characteristics are greatly improved in the reception filter, not just in the transmission filter.

In a ladder filter according to a preferred embodiment of the present invention, the power durability is high and degradation of electrical characteristics such as a VSWR characteristic and a filter characteristic is significantly reduced or prevented.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
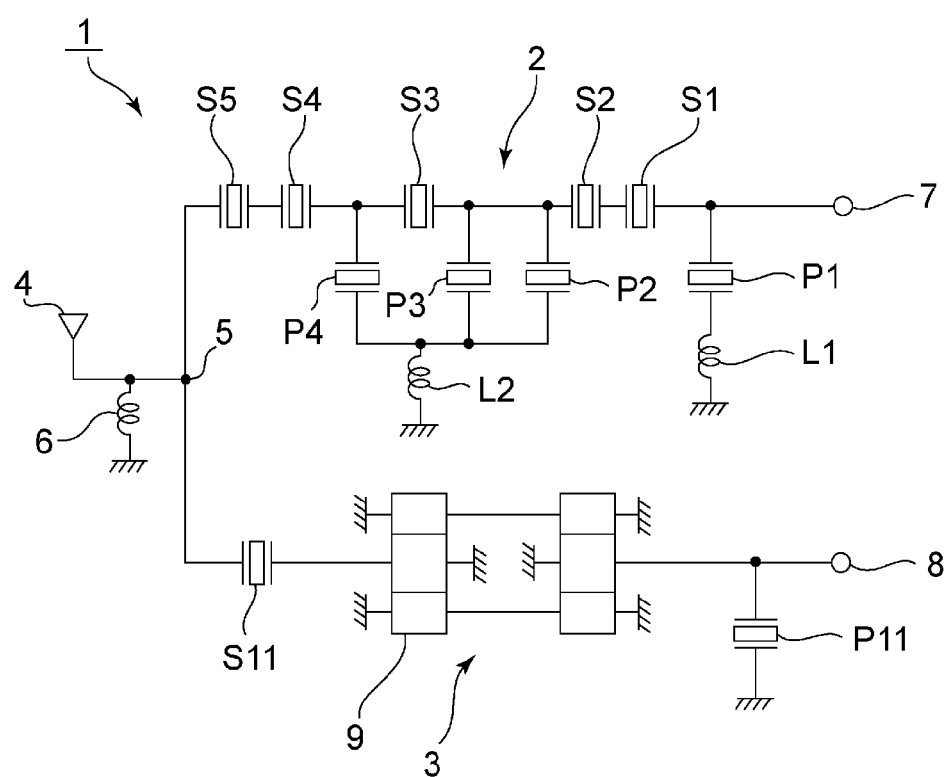
FIG. 1 is a circuit diagram of a duplexer according to a first preferred embodiment of the present invention.

Hereafter, the present invention will be made clearer by describing specific preferred embodiments of the present invention while referring to the drawings.

FIG. 1 is a circuit diagram of a duplexer including a ladder filter according to a first preferred embodiment of the present invention.

A duplexer 1 includes a transmission filter 2 and a reception filter 3. A common connection terminal 5 is connected to an antenna terminal 4. An inductance 6 is provided between the common connection terminal 5 and the ground potential in order to achieve impedance matching. The transmission filter 2 includes a transmission terminal 7, which defines and functions as an input terminal, and the common connection terminal 5, which defines and functions as an output terminal. In addition, the reception filter 3 includes the common connection terminal 5, which defines and functions as an input terminal, and a reception terminal 8, which defines and functions as an output terminal.

The duplexer of this preferred embodiment is preferably used in Band 13, for example. In Band 13, the transmission band is 777 MHz to 787 MHz and the reception band is 746 MHz to 756 MHz.

In the duplexer 1, the transmission filter 2 preferably is a ladder surface acoustic wave filter and this ladder surface acoustic wave filter corresponds to the ladder filter of the first preferred embodiment of the present invention.

The reception filter 3 includes a resonator S11 connected to the common connection terminal 5. A longitudinally-coupled-resonator-type surface acoustic wave filter 9 is connected subsequent to the resonator S11. The longitudinally-coupled-resonator-type surface acoustic wave filter 9 has a configuration in which two 3-IDT-type longitudinally-coupled-resonator-type surface acoustic wave filters are cascade connected to each other. A resonator P11 is connected between an output terminal of the longitudinally-coupled-resonator-type surface acoustic wave filter 9 and the ground potential.

In the transmission filter 2, series-arm resonators S1 to S5 are arranged in a series arm in order from the side of the transmission terminal 7, which defines and functions as an input terminal. The series-arm resonators S1 to S5 are connected in series with each other. In addition, parallel-arm resonators P1 to P4 are connected between the series arm and the ground potential in order from the transmission terminal 7 side. The parallel-arm resonator P1 is connected between an input terminal of the series-arm resonator S1 and the ground potential. An inductance L1 is connected between the parallel-arm resonator P1 and the ground potential.

One end of each of the parallel-arm resonators P2 and P3 is electrically connected to a connection point between the series-arm resonator S2 and the series-arm resonator S3 and the other ends of the parallel-arm resonators P2 and P3 define a common connection. Furthermore, one end of the parallel-arm resonator P4 is connected to a connection point between the series-arm resonators S3 and S4 and the other end of the parallel-arm resonator P4 defines a common connection with the parallel-arm resonators P2 and P3. An inductance L2 is connected between the portion where the parallel-arm resonators P2 to P4 define a common connection with each other and the ground potential.

Since the transmission filter 2 includes a ladder surface acoustic wave filter, the plurality of series-arm resonators S1 to S5 and parallel-arm resonators P1 to P4 of the transmission filter 2 preferably include a surface acoustic wave resonator.

The duplexer 1 is defined by providing electrodes that realize this circuit configuration on a $LiTaO_3$ substrate and providing the inductances 6, L1 and L2. Al is preferably used as an electrode material in this preferred embodiment. However, the materials forming the piezoelectric substrate and the electrodes are not limited to those described above.

Characteristics of the transmission filter 2 including the ladder filter of this preferred embodiment are that the electrostatic capacity of the series-arm resonator S1, which is closest to the transmission terminal 7, which is the input terminal, is the smallest among electrostatic capacities of the plurality of series-arm resonators S1 to S5, and 1) the metallization ratio of the series-arm resonator S1 having the smallest electrostatic capacity is the smallest among the metallization ratios of the series-arm resonators S1 to S5, and 2) the electrode finger pitch of the series-arm resonator S1 having the smallest electrostatic capacity is the largest among the electrode finger pitches of the plurality of series-arm resonators S1 to S5.

Therefore, the power durability is able to be made high without increasing the electrostatic capacity and it is possible to significantly reduce or prevent degradation of electrical characteristics such as a filter characteristic and a VSWR characteristic. This will be explained on the basis of a specific experimental examples. The term "metallization ratio" refers to a ratio obtained by dividing the width of the electrode fingers in a direction extending along a propagation direction of a surface acoustic wave by the sum of the width of the electrode fingers and the interval between the electrode fingers.

Design parameters of the series-arm resonators S1 to S5 of the transmission filter of the first preferred embodiment are illustrated in Table 1 below.

TABLE 1

|  | S1 | S2 | S3 | S4 | S5 |
|---|---|---|---|---|---|
| ELECTRODE FINGER PITCH (μm) | 2.512 | 2.432 | 2.389 | 2.415 | 2.432 |
| DUTY | 0.4 | 0.6 | 0.6 | 0.6 | 0.6 |
| ELECTROSTATIC CAPACITY (pF) | 2.1 | 2.8 | 2.3 | 3.4 | 3.7 |
| INTERSECTING WIDTH | 78 | 48 | 74 | 58 | 103 |
| NUMBER OF PAIRS | 80 | 120 | 65 | 121 | 74 |
| PRODUCT OF INTERSECTING WIDTH AND NUMBER OF PAIRS | 6240 | 5760 | 4810 | 7018 | 7622 |

For comparison, a transmission filter of comparative example 1 was manufactured similarly to the first preferred embodiment except that the series-arm resonators S1 to S5 were as illustrated in Table 2 below.

TABLE 2

|  | S1 | S2 | S3 | S4 | S5 |
|---|---|---|---|---|---|
| ELECTRODE FINGER PITCH (μm) | 2.429 | 2.432 | 2.389 | 2.415 | 2.432 |
| DUTY | 0.6 | 0.6 | 0.6 | 0.6 | 0.6 |
| ELECTROSTATIC CAPACITY (pF) | 2.0 | 2.8 | 2.3 | 3.4 | 3.7 |
| INTERSECTING WIDTH | 48 | 48 | 74 | 58 | 103 |
| NUMBER OF PAIRS | 80 | 120 | 65 | 121 | 74 |

As is clear from Table 2, the metallization ratios, that is, the duties of the series-arm resonators S1 to S5 are all equal to 0.6 in comparative example 1.

In addition, the electrode finger pitch of the series-arm resonator S1 is not the largest among the electrode finger pitches of the series-arm resonators S1 to S5.

In contrast, as is clear from Table 1, in the first preferred embodiment, the duty of the series-arm resonator S1 is 0.4 and is smaller than the duties of the other series-arm resonators S2 to S5. Furthermore, the electrode finger pitch of the series-arm resonator S1, which is arranged farthermost toward the input side of the transmission filter where the applied power is greatest is largest among the electrode finger pitches of the series-arm resonators S1 to S5.

Figure 2:
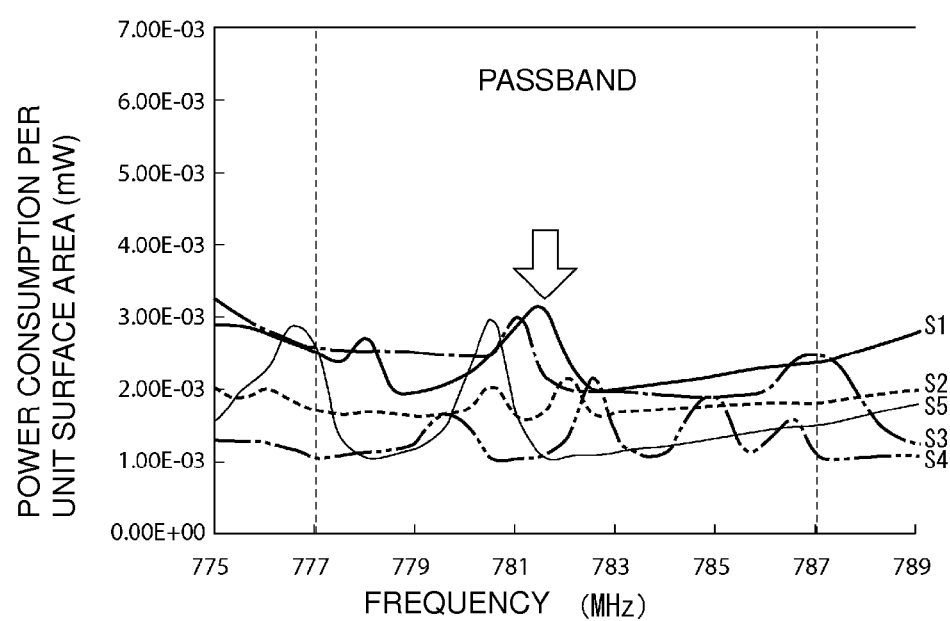
FIG. 2 is a diagram illustrating the relationship between power consumption and frequency for each series-arm resonator of a ladder filter according to the first preferred embodiment of the present invention.
Figure 3:
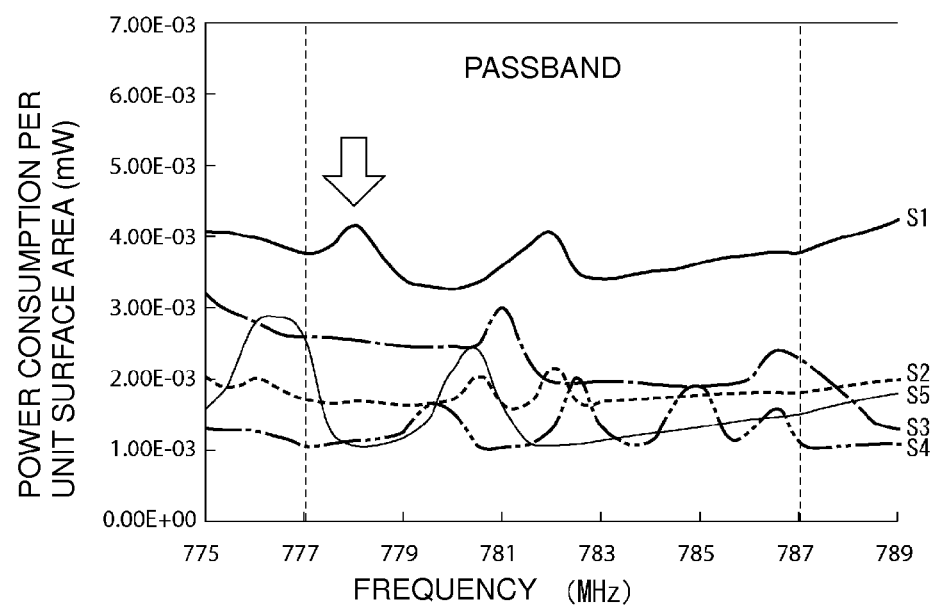
FIG. 3 is a diagram illustrating the relationship between power consumption and frequency for each series-arm resonator of a ladder filter according to comparative example 1 of the present invention.

FIG. 2 is a diagram illustrating the relationship between power consumption and frequency for each series-arm resonator of the first preferred embodiment. Furthermore, FIG. 3 is a diagram illustrating the relationship between power consumption and frequency for each series-arm resonator of comparative example 1. In the characteristics illustrated in FIG. 2 and FIG. 3, the power consumption per unit surface area of each of the series-arm resonators S1 to S5 was obtained when a power of about 800 mW was applied to the transmission terminal.

The electrode load is larger for series-arm resonators having larger power consumptions. Therefore, the IDT electrodes are easily damaged by electro-migration induced by the applied power. That is, the power durability is low.

In comparative example 1, the power consumption of the series-arm resonator S1, which is closest to the transmission terminal 7, is the highest. Therefore, generation of heat is the largest when a large power is applied and damage is easily caused. Therefore, in order to increase the power durability, it is necessary to reduce the power consumption of the series-arm resonator S1.

In contrast, as is clear from FIG. 2, in the first preferred embodiment, power consumption is reduced by approximately 25% compared with comparative example 1 in a portion where power consumption is highest in the transmission band of the series-arm resonator S1. Therefore, according to the first preferred embodiment, the heat resistance load of the IDT electrodes is small compared with comparative example 1 and it is possible to make the power durability high.

Figure 4:
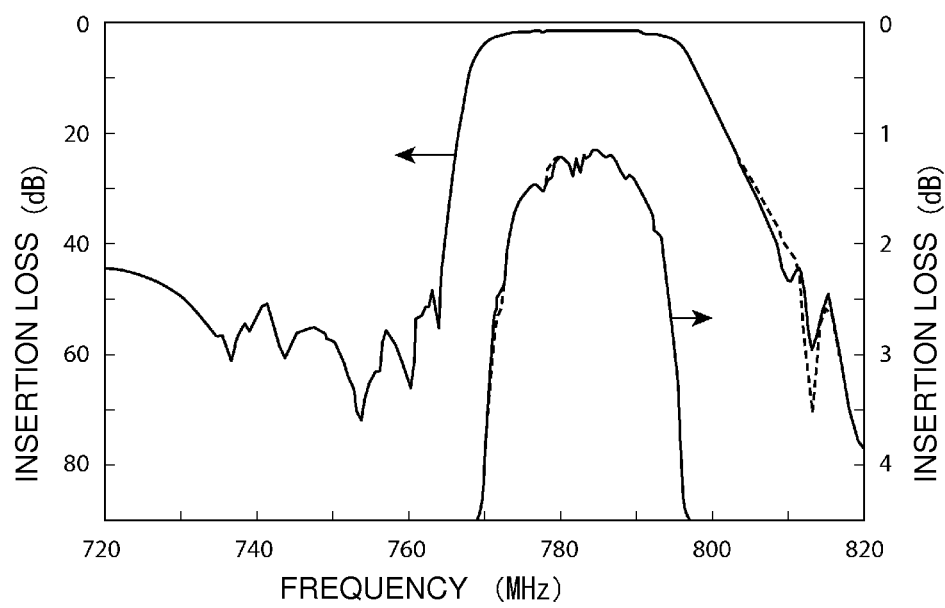
FIG. 4 is a diagram illustrating attenuation frequency characteristics of the ladder filters of the first preferred embodiment of the present invention and comparative example 1.

In addition, FIG. 4 is a diagram illustrating attenuation frequency characteristics of the transmission filters of the first preferred embodiment and comparative example 1. Solid lines represent results of the first preferred embodiment and broken lines represent results of comparative example 1. As is clear from FIG. 4, filter characteristics that are substantially the same as those in comparative example 1 are obtained in the first preferred embodiment.

Figure 5:
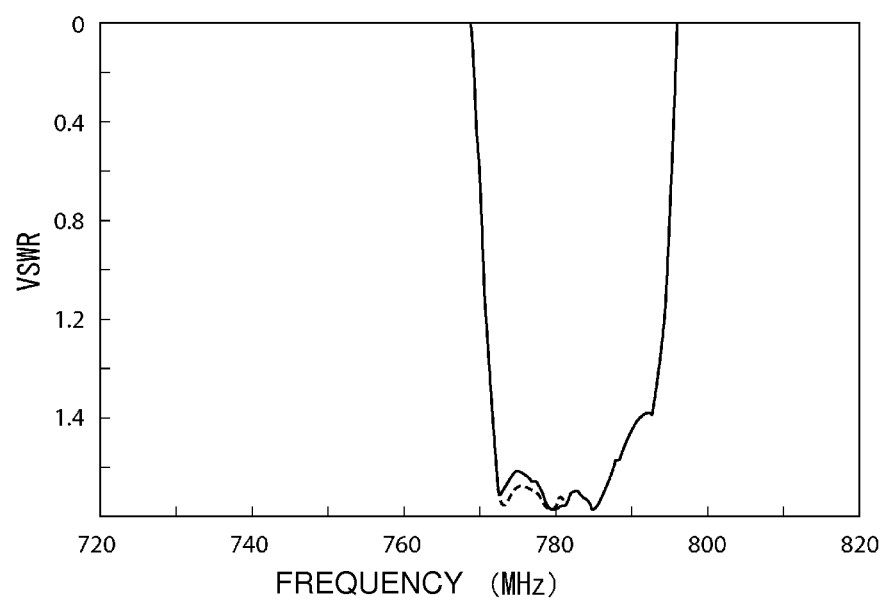
FIG. 5 is a diagram illustrating VSWR characteristics of the ladder filters of the first preferred embodiment of the present invention and comparative example 1.

In addition, FIG. 5 is a diagram illustrating VSWR characteristics at a transmission terminal side in the first preferred embodiment and comparative example 1. A solid line represents results of the first preferred embodiment and a broken line represents results of comparative example 1. As is clear from FIG. 5, the VSWR characteristic in the first preferred embodiment is substantially not degraded compared with the VSWR characteristic in comparative example 1.

Figure 6:
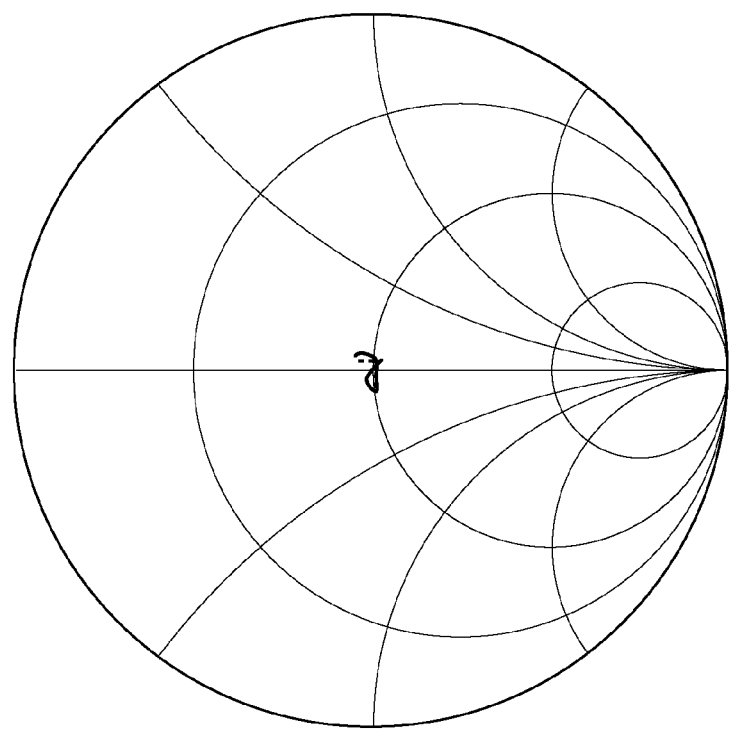
FIG. 6 is an impedance Smith chart illustrating transmission-terminal-side impedance characteristics of the ladder filters of the first preferred embodiment of the present invention and comparative example 1.

In the impedance Smith chart of FIG. 6, a solid line represents results of the first preferred embodiment and a broken line represents results of comparative example 1. It is clear that the impedance characteristic is also substantially not reduced in the first preferred embodiment compared with comparative example 1.

Therefore, as described above, with the first preferred embodiment, it is clear that the power durability is able to be effectively made high substantially without the VSWR characteristic, filter characteristic and impedance characteristic being degraded. This is thought to be due to the following reason. By making the metallization ratio, that is, the duty the smallest and the electrode finger pitch the largest in the series-arm resonator S1 having the smallest electrostatic capacity, the intersecting width or number of pairs of electrode fingers are able to be made large without greatly changing the electrostatic capacity. Therefore, it is possible to make the power durability high without degradation of the electrical characteristics.

Next, a duplexer including a transmission filter of comparative example 2 was manufactured similarly to comparative example 1 except that the design parameters of the series-arm resonators S1 to S5 were as illustrated in Table 3 below.

TABLE 3

|  | S1 | S2 | S3 | S4 | S5 |
|---|---|---|---|---|---|
| ELECTRODE FINGER PITCH (μm) | 2.429 | 2.432 | 2.389 | 2.415 | 2.432 |
| DUTY | 0.6 | 0.6 | 0.6 | 0.6 | 0.6 |
| ELECTROSTATIC CAPACITY (pF) | 2.5 | 2.8 | 2.3 | 3.4 | 3.7 |
| INTERSECTING WIDTH | 65 | 48 | 74 | 58 | 103 |
| NUMBER OF PAIRS | 80 | 120 | 65 | 121 | 74 |

As is clear from Table 3, in comparative example 2, the metallization ratio, that is, the duty of the series-arm resonator S1 is the same as that in comparative example 1, but the intersecting width of the electrode fingers was made larger and the electrostatic capacity was made larger than in comparative example 1. Other than this point, comparative example 2 is the same as comparative example 1.

Figure 7:
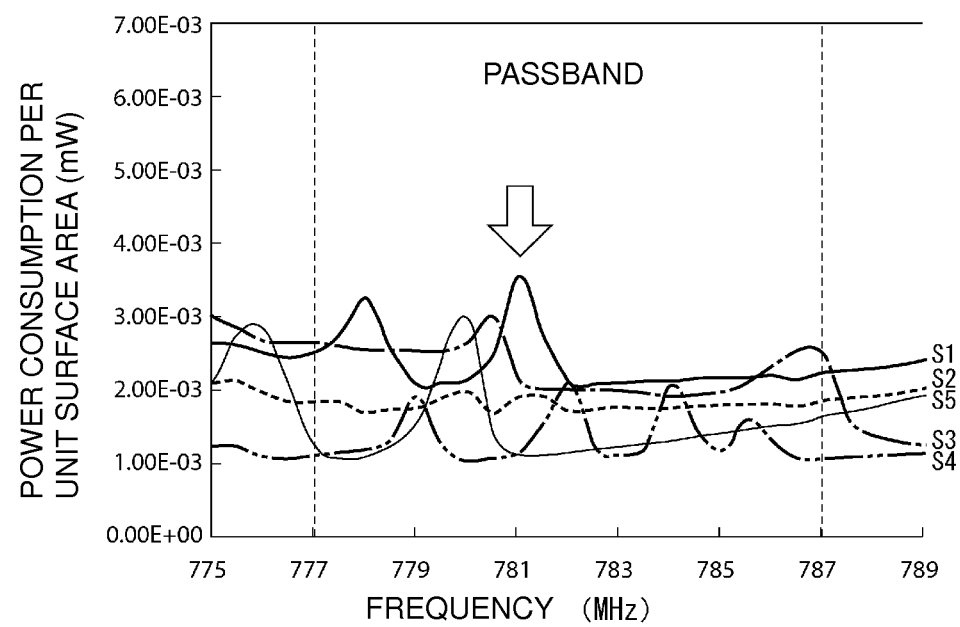
FIG. 7 is a diagram illustrating the relationship between power consumption and frequency for each series-arm resonator of a ladder filter of comparative example 2.

FIG. 7 is a diagram illustrating the relationship between power consumption and frequency for the series-arm resonators S1 to S5 of comparative example 2.

Figure 8:
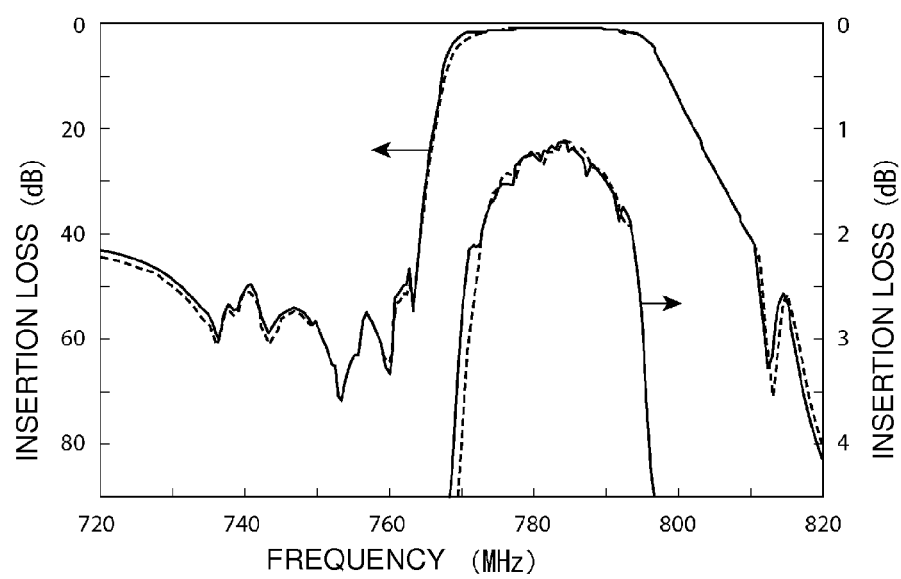
FIG. 8 is a diagram illustrating attenuation frequency characteristics of the ladder filters of comparative example 1 and comparative example 2.
Figure 9:
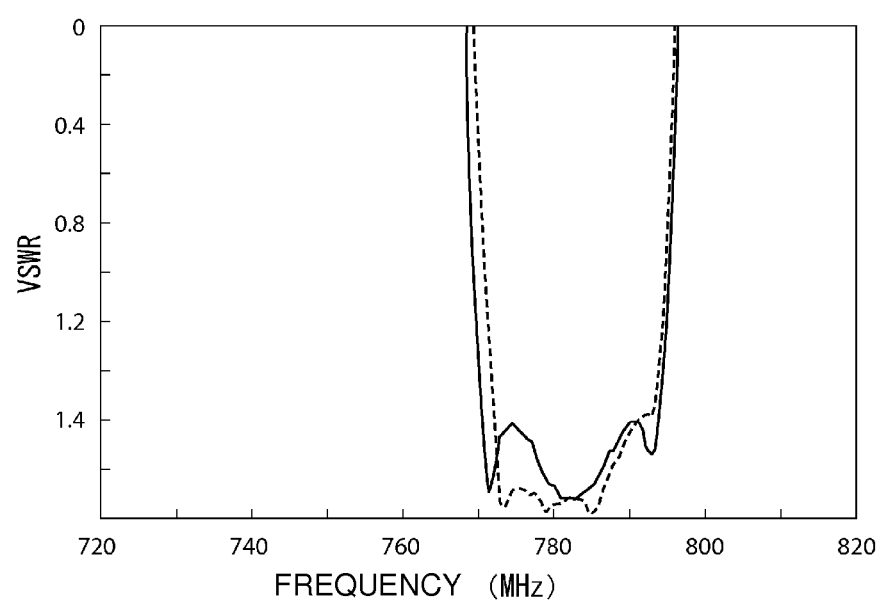
FIG. 9 is a diagram illustrating VSWR characteristics at a transmission-terminal-side end portion of ladder filters of comparative example 1 and comparative example 2.
Figure 10:
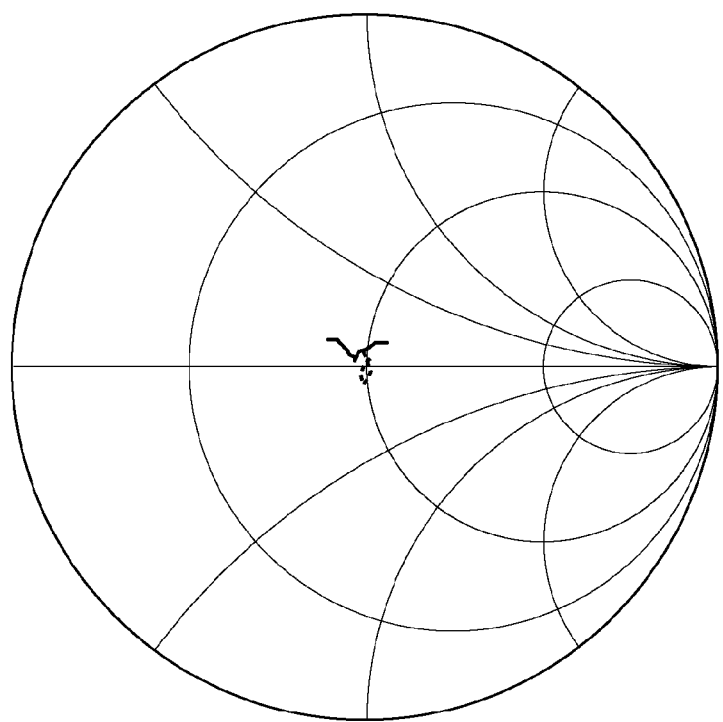
FIG. 10 is an impedance Smith chart illustrating impedance characteristics at the transmission terminal side of the ladder filters of comparative example 1 and comparative example 2.

FIGS. 8 to 10 illustrate electrical characteristics of comparative example 1 and comparative example 2. In FIGS. 8 to 10, the solid lines represent results of comparative example 2 and the broken lines represent results of comparative example 1.

FIG. 8 illustrates filter characteristics, FIG. 9 illustrates VSWR characteristics and FIG. 10 is an impedance Smith chart illustrating impedance characteristics at a transmission terminal side.

As is clear from FIG. 8, in comparative example 2, as a result of the electrostatic capacity of the series-arm resonator S1 being made larger, the peak power consumption in the transmission band is about 15% smaller than in comparative example 1.

However, as is clear from FIG. 9, the smallest VSWR in the transmission band is degraded from about 1.13 to about 1.38 in the VSWR characteristic. In addition, as is clear from FIG. 10, in the impedance characteristic, the spread of the spiral in the impedance Smith chart shifted from about 50Ω becomes larger and is degraded. If we consider impedance matching with a power amplifier, it is preferable that the spiral in the impedance Smith chart be small.

As described above, it is clear that there is a problem that although the power durability can be improved in comparative example 2 compared with comparative example 1, the electrical characteristics are degraded, in particular, degradation of the VSWR characteristic and impedance characteristic is large.

Figure 11:
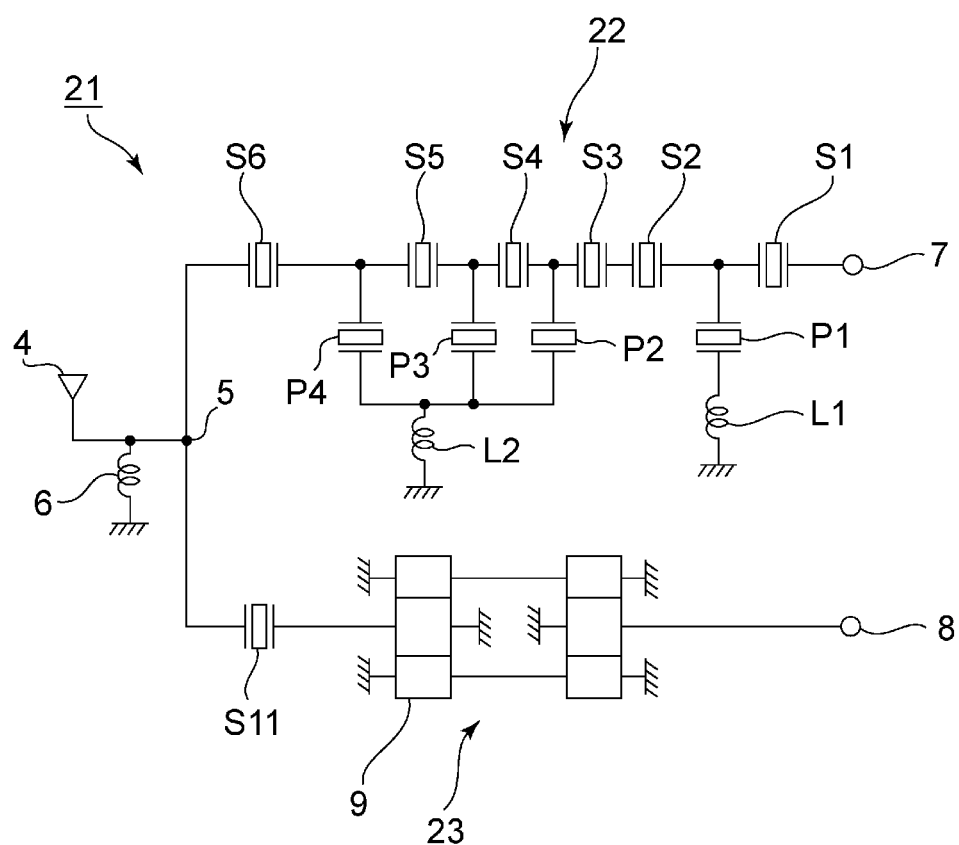
FIG. 11 is a circuit diagram of a duplexer according to a second preferred embodiment of the present invention.

FIG. 11 is a circuit diagram of a duplexer including a transmission filter according to a second preferred embodiment of the present invention.

As illustrated in FIG. 11, in a duplexer 21 of the second preferred embodiment, series-arm resonators S1 to S6 were arranged in order from a transmission terminal 7 side. In addition, one end of a parallel-arm resonator P1 was connected to a connection point between the series-arm resonators S1 and S2. Furthermore, one end of a parallel-arm resonator P2 was connected to a connection point between the series-arm resonators S3 and S4 and one end of a parallel-arm resonator P3 was connected to a connection point between the series-arm resonators S4 and S5. One end of a parallel-arm resonator P4 is connected to a connection point between the series-arm resonators S5 and S6. The other ends of the parallel-arm resonators P2 to P4 defined a common connection. An inductance L2 was connected between the common connection point of the parallel-arm resonators P2 to P4 and the ground potential. In addition, a resonator P11 having one end connected to the ground potential was not provided on a reception filter 23 side. Since the rest of the configuration of the duplexer 21 is the same as that of the duplexer 1, like portions are denoted by like reference numbers and accordingly description thereof is omitted.

Design parameters of the series-arm resonators S1 to S6 of a transmission filter 22 of the duplexer 21 are illustrated in Table 4 below.

TABLE 4

|  | S1 | S2 | S3 | S4 | S5 | S6 |
|---|---|---|---|---|---|---|
| ELECTRODE FINGER PITCH (μm) | 2.560 | 2.622 | 2.625 | 2.664 | 2.635 | 2.621 |
| DUTY | 0.63 | 0.63 | 0.63 | 0.47 | 0.63 | 0.63 |
| ELECTRO-STATIC CAPACITY (pF) | 5.1 | 5.8 | 3.8 | 3.7 | 5.1 | 4.0 |
| INTER-SECTING WIDTH | 65 | 80 | 60 | 91 | 84 | 77 |
| NUMBER OF PAIRS | 150 | 140 | 120 | 100 | 116 | 110 |

For comparison, a duplexer of comparative example 3 was manufactured similarly to the second preferred embodiment except that the design parameters of the series-arm resonators S1 to S6 were as illustrated in Table 5 below.

TABLE 5

|  | S1 | S2 | S3 | S4 | S5 | S6 |
|---|---|---|---|---|---|---|
| ELECTRODE FINGER PITCH (μm) | 2.560 | 2.622 | 2.625 | 2.634 | 2.635 | 2.621 |
| DUTY | 0.63 | 0.63 | 0.63 | 0.63 | 0.63 | 0.63 |
| ELECTRO-STATIC CAPACITY (pF) | 5.1 | 5.8 | 3.8 | 3.6 | 5.1 | 4.0 |
| INTER-SECTING WIDTH | 65 | 80 | 60 | 69 | 84 | 77 |
| NUMBER OF PAIRS | 150 | 140 | 120 | 100 | 116 | 110 |

As is clear from Table 5, in comparative example 3, the electrostatic capacity of the series-arm resonator S4 is the smallest at 3.6 pF. However, the duty, that is, the metallization ratio of the series-arm resonator S4 is the same as that of the other series-arm resonators S1 to S3, S5 and S6. Regarding the electrode finger pitch, the electrode finger pitch of the series-arm resonator S4 is not the largest among the electrode finger pitches of the series-arm resonators S1 to S6.

In contrast, as illustrated in Table 4, in the second preferred embodiment, the electrostatic capacity of the series-arm resonator S4 is the smallest at 3.7 pF. The metallization ratio, that is, the duty of the series-arm resonator S4 is the smallest at 0.47. In addition, the electrode finger pitch is 2.664 μm and is the largest among the series-arm resonators S1 to S6.

Figure 12:
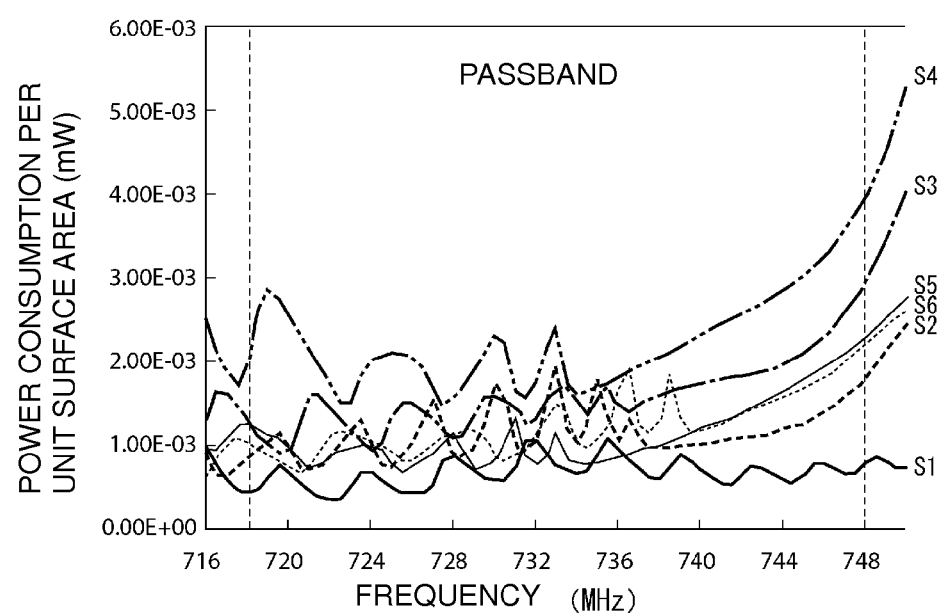
FIG. 12 is a diagram illustrating the relationship between power consumption and frequency for each series-arm resonator of comparative example 3.
Figure 13:
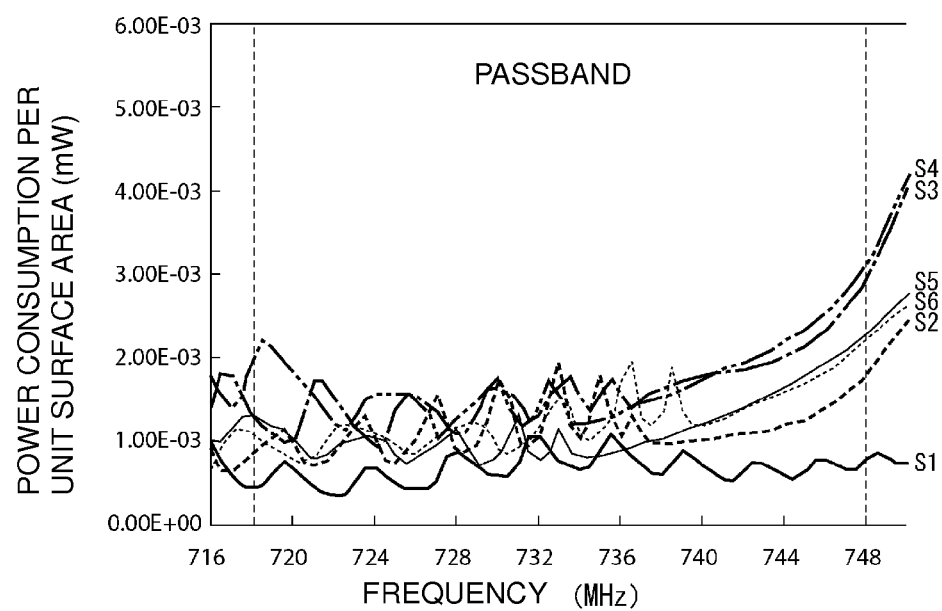
FIG. 13 is a diagram illustrating the relationship between power consumption and frequency for each series-arm resonator of a ladder filter according to the second preferred embodiment of the present invention.

FIG. 12 is a diagram illustrating the relationship between power consumption and frequency for the series-arm resonators S1 to S6 of comparative example 3, and FIG. 13 is a diagram illustrating the relationship between power consumption and frequency for the series-arm resonators S1 to S6 of the second preferred embodiment.

Compared to comparative example 3, it is clear that the peak of power consumption of the series-arm resonator S4 in the transmission band is about 25% lower in the second preferred embodiment compared with comparative example 3. Therefore, the power durability is effectively increased.

Figure 14:
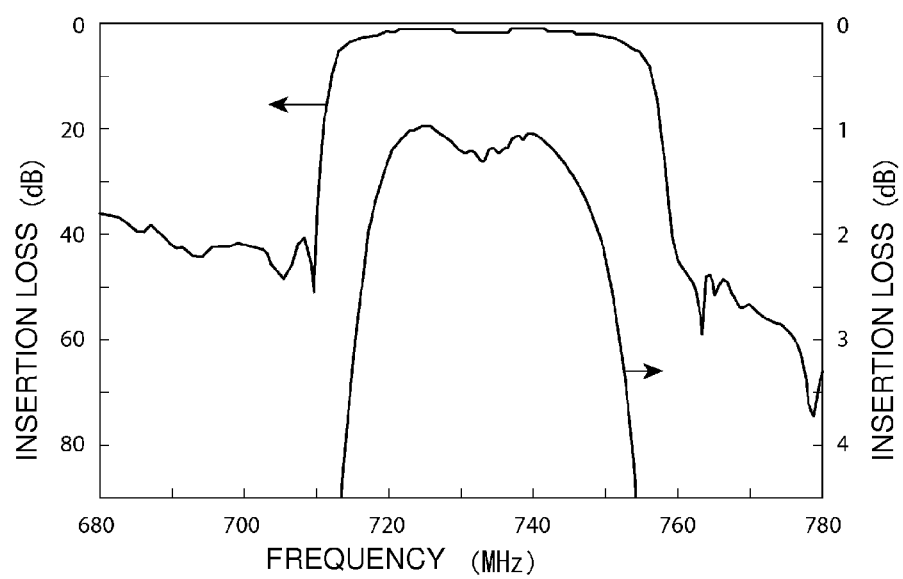
FIG. 14 is a diagram illustrating attenuation frequency characteristics of the ladder filters of the second preferred embodiment of the present invention and comparative example 3.
Figure 15:
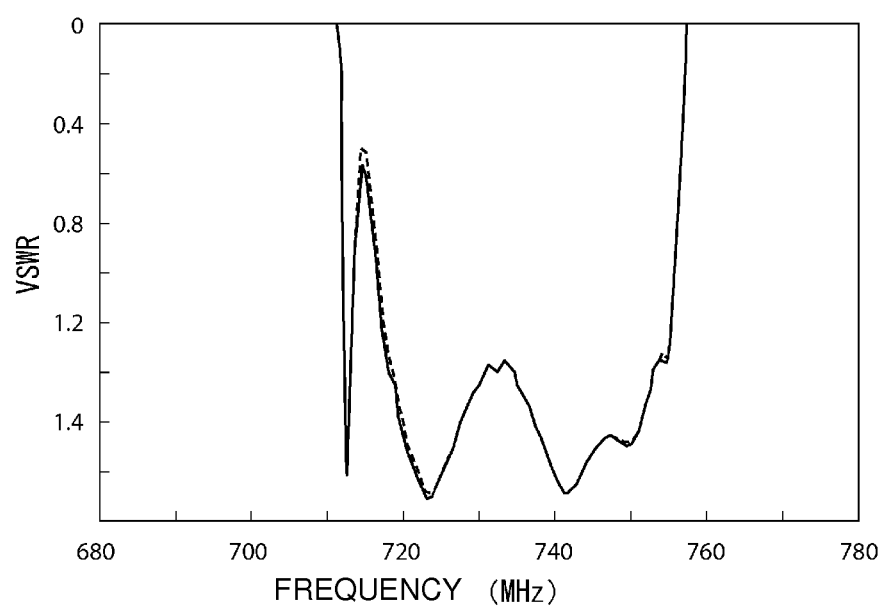
FIG. 15 is a diagram illustrating VSWR characteristics at a transmission-terminal-side end portion of ladder filters of the second preferred embodiment of the present invention and comparative example 3.
Figure 16:
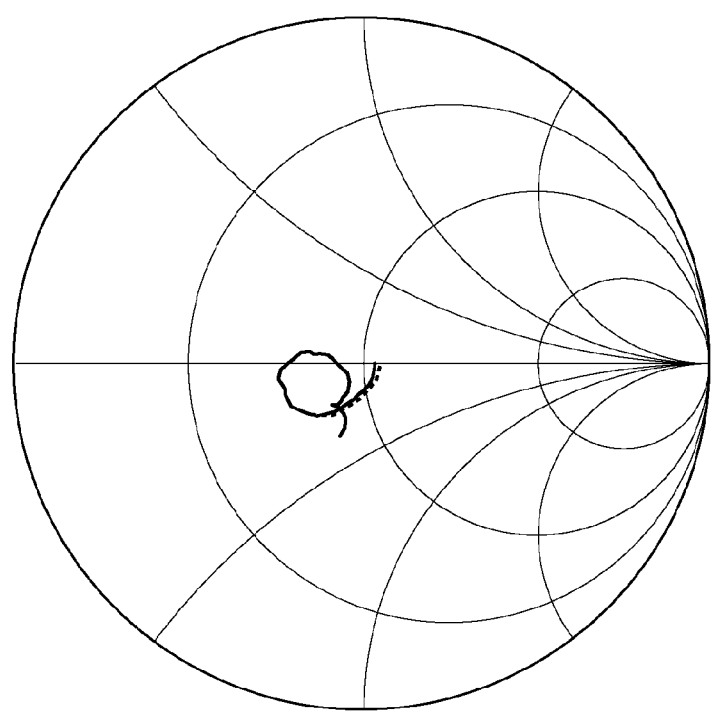
FIG. 16 is an impedance Smith chart illustrating transmission-terminal-side impedance characteristics of the ladder filters of the second preferred embodiment of the present invention and comparative example 3.

On the other hand, FIGS. 14 to 16 are diagrams illustrating a comparison of the electrical characteristics of transmission filters of comparative example 3 and the second preferred embodiment. FIG. 14 is a diagram illustrating filter characteristics, FIG. 15 is a diagram illustrating VSWR characteristics and FIG. 16 is a diagram illustrating an impedance Smith chart for the transmission terminal side.

In FIGS. 14 to 16, solid lines represent results of the second preferred embodiment and broken lines represent results of comparative example 3.

As is clear from FIGS. 14 to 16, there is substantially no difference between the filter characteristics, VSWR characteristics and impedance characteristics of the second preferred embodiment and comparative example 3. Therefore, in the second preferred embodiment as well, it is clear that the power durability is able to be effectively made high while substantially not causing degradation of the electrical characteristics.

Furthermore, if the first preferred embodiment and the second preferred embodiment are compared, the power durability is more effectively made high in the first preferred embodiment in which a characteristic configuration of the invention of the present application is adopted for the series-arm resonator S1 closest to the transmission terminal, that is, the input terminal to which power is applied. Therefore, the first preferred embodiment is preferred over the second preferred embodiment.

In addition, it is preferable that the series-arm resonator S1, which has a small electrostatic capacity compared to the other series-arm resonators, include a plurality of division resonators that have a combined electrostatic capacity that is equal to the electrostatic capacity of the series-arm resonator S1 and that are connected in series with each other. Here, it is further preferable that the division resonators have the same configuration as each other in order that loss due to a difference in impedance or resonant frequency between the serially connected division resonators is significantly reduced.

Ladder filters according to various preferred embodiments of the present invention may be suitably used in various types of band pass filters, but are particularly effective in a transmission filter of a duplexer in which improvement of electric power handling capability is more strongly required.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A ladder filter comprising:
a plurality of series-arm resonators including a surface acoustic wave resonator; and
a parallel-arm resonator including a surface acoustic wave resonator; wherein
a metallization ratio of a series-arm resonator with a smallest electrostatic capacity among the plurality of series-arm resonators is smallest among the plurality of series-arm resonators and an electrode finger pitch of the series-arm resonator having the smallest electrostatic capacity is largest among electrode finger pitches of the plurality of series-arm resonators.

2. The ladder filter according to claim 1, wherein the plurality of series-arm resonator includes at least three series-arm resonators.

3. The ladder filter according to claim 1, wherein the series-arm resonator having the smallest electrostatic capacity is serially divided to include a first division resonator and a second division resonator connected in series with the first division resonator.

4. The ladder filter according to claim 1, further comprising:
an input terminal and an output terminal; wherein
the plurality of series-arm resonators are provided in a series arm that links the input terminal and the output terminal to each other, and the series-arm resonator having the smallest electrostatic capacity is closest to the input terminal among the plurality of series-arm resonators.

5. The ladder filter according to claim 1, wherein the ladder filter is a transmission filter.

6. The ladder filter according to claim 1, wherein an inductance is connected between the parallel-arm resonator and a ground potential.

7. The ladder filter according to claim 1, wherein a plurality of the parallel-arm resonators is provided and connected between the plurality of series-arm resonators and a ground potential.

8. The ladder filter according to claim 1, wherein the plurality of series-arm resonator includes at least six series-arm resonators.

9. A duplexer comprising:
a transmission filter including the ladder filter according to claim 1; and
a reception filter including one end that defines a common connection with one end of the transmission filter.

10. The duplexer according to claim 9, further comprising an antenna terminal connected to the common connection.

11. The duplexer according to claim 9, further comprising an inductance between the common connection and a ground.

12. The duplexer according to claim 9, wherein the reception filter includes a resonator and a longitudinally-coupled-resonator surface acoustic wave filter.

13. The duplexer according to claim 12, wherein the longitudinally-coupled-resonator surface acoustic wave filter includes at least two 3-IDT longitudinally-coupled-resonator surface acoustic wave filters cascade connected to each other.

14. The duplexer according to claim 9, wherein the plurality of series-arm resonator includes at least three series-arm resonators.

15. The duplexer according to claim 9, wherein the series-arm resonator having the smallest electrostatic capacity is serially divided to include a first division resonator and a second division resonator connected in series with the first division resonator.

16. The duplexer according to claim 9, wherein the transmission filter further comprises:
an input terminal and an output terminal; wherein
the plurality of series-arm resonators are provided in a series arm that links the input terminal and the output terminal to each other, and the series-arm resonator having the smallest electrostatic capacity is closest to the input terminal among the plurality of series-arm resonators.

17. The duplexer according to claim 9, wherein the ladder filter is a transmission filter.

18. The duplexer according to claim 9, wherein an inductance is connected between the parallel-arm resonator and a ground potential.

19. The duplexer according to claim 9, wherein a plurality of the parallel-arm resonators is provided and connected between the plurality of series-arm resonators and a ground potential.

20. The duplexer according to claim 9, wherein the plurality of series-arm resonator includes at least six series-arm resonators.

* * * * *